US008819367B1

(12) United States Patent
Fallone et al.

(10) Patent No.: US 8,819,367 B1
(45) Date of Patent: Aug. 26, 2014

(54) ACCELERATED TRANSLATION POWER RECOVERY

(75) Inventors: Robert M. Fallone, Newport Beach, CA (US); William B. Boyle, Lake Forest, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 325 days.

(21) Appl. No.: 13/330,426

(22) Filed: Dec. 19, 2011

(51) Int. Cl.
*G06F 12/16* (2006.01)
*G06F 11/14* (2006.01)
*G11C 29/18* (2006.01)

(52) U.S. Cl.
CPC .... *G06F 11/1456* (2013.01); *G11C 2029/1806* (2013.01)
USPC .......................................................... 711/162

(58) Field of Classification Search
None
See application file for complete search history.

(56) References Cited

U.S. PATENT DOCUMENTS 4,769,770 A 9/1988 Miyadera et al.
5,613,066 A 3/1997 Matsushima et al.
6,092,231 A 7/2000 Sze
6,202,121 B1 3/2001 Walsh et al.
6,324,604 B1 11/2001 Don et al.
6,339,811 B1 1/2002 Gaertner et al.
6,574,774 B1 6/2003 Vasiliev
6,772,274 B1 8/2004 Estakhri
6,829,688 B2 12/2004 Grubbs et al.
6,886,068 B2 4/2005 Tomita
6,895,468 B2 5/2005 Rege et al.
6,901,479 B2 5/2005 Tomita
6,920,455 B1 7/2005 Weschler
6,967,810 B2 11/2005 Kasiraj et al.
7,155,448 B2 12/2006 Winter
7,412,585 B2 8/2008 Uemura
7,486,460 B2 2/2009 Tsuchinaga et al.
7,490,212 B2 2/2009 Kasiraj et al.
7,509,471 B2 3/2009 Gorobets
7,529,880 B2 5/2009 Chung et al.
7,539,924 B1 5/2009 Vasquez et al.
7,603,530 B1 10/2009 Liikanen et al.
7,647,544 B1 1/2010 Masiewicz
7,669,044 B2 2/2010 Fitzgerald et al.
7,685,360 B1 3/2010 Brunnett et al.
7,840,878 B1 11/2010 Tang et al.
8,006,027 B1 8/2011 Stevens et al.
2004/0019718 A1 1/2004 Schauer et al.
2004/0109376 A1 6/2004 Lin
2005/0071537 A1 3/2005 New et al.
2005/0144517 A1 6/2005 Zayas
2006/0090030 A1 4/2006 Ijdens et al.
2006/0112138 A1 5/2006 Fenske et al.
2006/0117161 A1 6/2006 Venturi (Continued)

FOREIGN PATENT DOCUMENTS

WO 2009/102425 A1 8/2009

OTHER PUBLICATIONS

Rosenblum, Mendel and Ousterhout, John K. (Feb. 1992), "The Design and Implementation of a Log-Structured File System." ACM Transactions on Computer Systems, vol. 10, Issue 1, pp. 26-52.

(Continued)

*Primary Examiner* — Duc Doan

(57) ABSTRACT

Embodiments described herein include systems and methods for maintaining and/or recovering a logical-to-physical address mapping of a storage subsystem. Certain of these embodiments improve system performance by reducing resource and time consumption involved in reconstructing a logical-to-physical mapping at power-up.

21 Claims, 4 Drawing Sheets

(56) References Cited

U.S. PATENT DOCUMENTS

| | | | |
|---|---|---|---|
| 2006/0181993 | A1 | 8/2006 | Blacquiere et al. |
| 2007/0016721 | A1 | 1/2007 | Gay |
| 2007/0067603 | A1 | 3/2007 | Yamamoto et al. |
| 2007/0204100 | A1 | 8/2007 | Shin et al. |
| 2007/0226394 | A1 | 9/2007 | Noble |
| 2007/0245064 | A1 | 10/2007 | Liu |
| 2007/0288686 | A1 | 12/2007 | Arcedera et al. |
| 2007/0294589 | A1 | 12/2007 | Jarvis et al. |
| 2008/0098195 | A1 | 4/2008 | Cheon et al. |
| 2008/0104308 | A1 | 5/2008 | Mo et al. |
| 2008/0183955 | A1 | 7/2008 | Yang et al. |
| 2008/0195801 | A1 | 8/2008 | Cheon et al. |
| 2008/0256287 | A1 | 10/2008 | Lee et al. |
| 2008/0256295 | A1 | 10/2008 | Lambert et al. |
| 2008/0270680 | A1 | 10/2008 | Chang |
| 2008/0307192 | A1 | 12/2008 | Sinclair et al. |
| 2009/0019218 | A1 | 1/2009 | Sinclair et al. |
| 2009/0043985 | A1 | 2/2009 | Tuuk et al. |
| 2009/0055620 | A1 | 2/2009 | Feldman et al. |
| 2009/0063548 | A1 | 3/2009 | Rusher et al. |
| 2009/0119353 | A1 | 5/2009 | Oh et al. |
| 2009/0150599 | A1 | 6/2009 | Bennett |
| 2009/0154254 | A1 | 6/2009 | Wong et al. |
| 2009/0164535 | A1 | 6/2009 | Gandhi et al. |
| 2009/0164696 | A1 | 6/2009 | Allen et al. |
| 2009/0187732 | A1 | 7/2009 | Greiner et al. |
| 2009/0193184 | A1 | 7/2009 | Yu et al. |
| 2009/0198952 | A1 | 8/2009 | Khmelnitsky et al. |
| 2009/0204750 | A1 | 8/2009 | Estakhri et al. |
| 2009/0222643 | A1 | 9/2009 | Chu |
| 2009/0240873 | A1 | 9/2009 | Yu et al. |
| 2009/0276604 | A1 | 11/2009 | Baird et al. |
| 2010/0011275 | A1 | 1/2010 | Yang |
| 2010/0208385 | A1 | 8/2010 | Toukairin |

OTHER PUBLICATIONS

Rosenblum, "The Design and Implementation of a Log-structured File System", EECS Department, University of California, Berkeley, Technical Report No. UCB/CSD-92-696, Jun. 1992.

"Amer, et al., ""Design Issues for a Shingled Write Disk System"", 26th IEEE Symposium on Massive Storage Systems and Technologies: Research Track (MSST2010), May 2010, 12 pages."

ACCELERATED TRANSLATION POWER RECOVERY

BACKGROUND

1. Technical Field

This disclosure relates to storage devices, which can include disk drives and solid state memory subsystems, for example. More particularly, this disclosure relates to techniques for managing metadata in a storage device to improve drive performance.

2. Description of the Related Art

Storage subsystems such as disk drives, solid state memories, and the like, often utilize logical-to-physical mappings to store data. Data is accessed using logical addresses from the mapping which correspond to physical locations on the memory device.

The storage subsystem may access the logical-to-physical mapping relatively frequently in order to locate data. Thus, the subsystem often stores a version of the logical-to-physical address mapping in a relatively fast memory (e.g., a volatile memory such as a DRAM). A copy of the mapping is also typically kept in non-volatile memory. This allows the subsystem to retrieve the mapping on power up, for example. Maintaining the logical-to-physical address mapping and restoring the mapping can be complex and resource intensive tasks.

DETAILED DESCRIPTION OF SPECIFIC EMBODIMENTS

Embodiments described herein include systems and methods for maintaining and/or recovering a logical-to-physical address mapping of a storage subsystem. Certain of these embodiments improve system performance by reducing resource and time consumption involved in reconstructing a logical-to-physical mapping, at power-up, for instance. And, in some cases, the techniques described herein reduce the amount of resources (e.g., non-volatile memory accesses) utilized in maintaining the mapping. Specific embodiments of systems and processes will now be described with reference to the drawings. This description is intended to illustrate specific embodiments of the inventions, and is not intended to be limiting. Thus, nothing in this description is intended to imply that any particular component, step or characteristic is essential. The inventions are defined only by the claims.

System Overview

Figure 1:
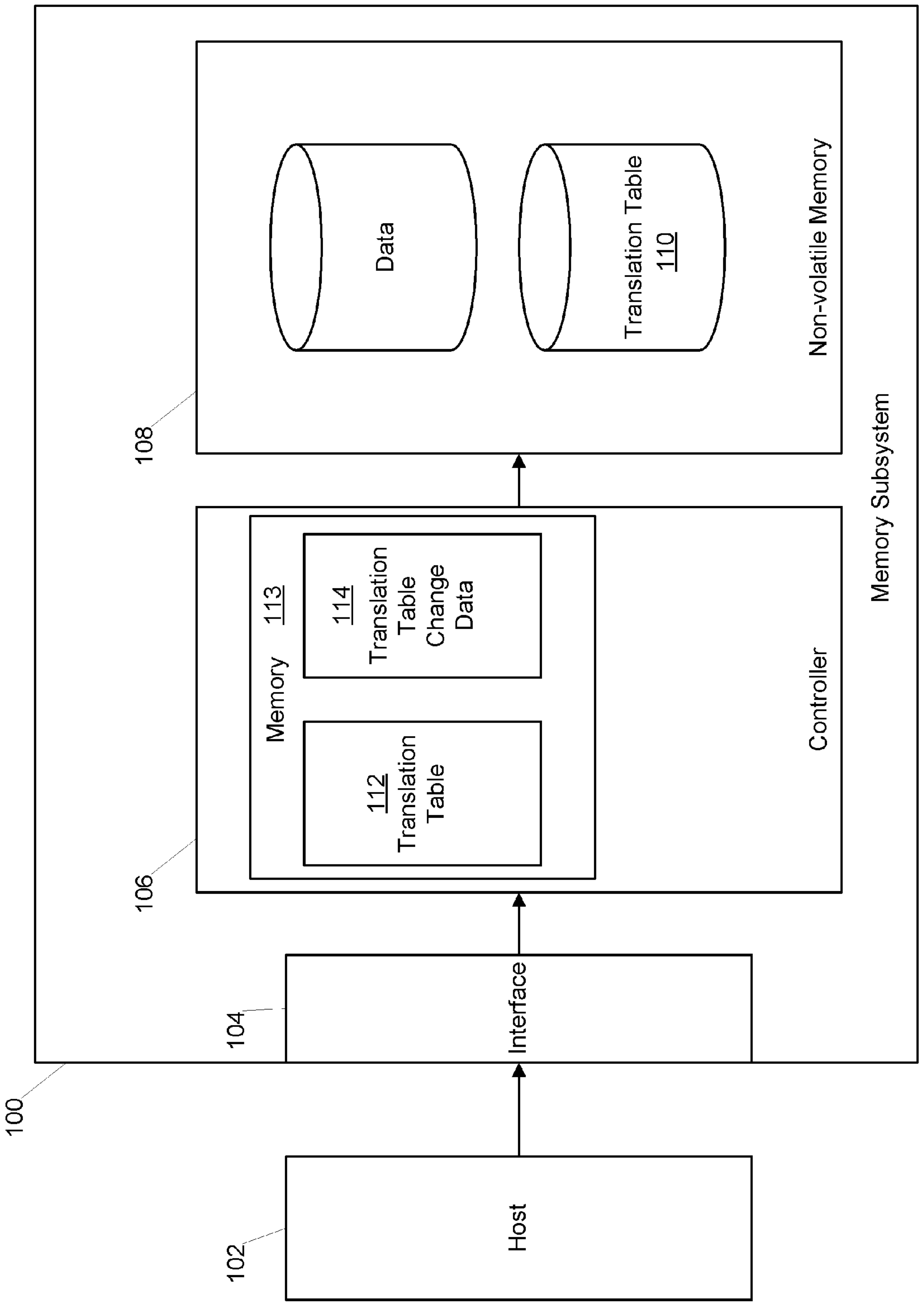
FIG. 1 shows an example storage subsystem according to an embodiment.

FIG. 1 shows an example storage subsystem 100. The storage subsystem 100 may be in communication with a host system 102, such as a server, desktop computer, laptop computer, mobile computing device such as a smartphone, or some other appropriate computing device. The subsystem 100 includes an interface 104 for communicating with the host system 100, a controller 106, and a first memory 108, which is a non-volatile memory.

The non-volatile memory 108 can include at least one non-volatile memory device, which can be a hard-disk, a solid-state memory, some other type of addressable storage subsystem, or any combination thereof. The non-volatile memory 108 is arranged in a plurality of addressable memory locations which can be organized in a variety of manners. In one embodiment, the non-volatile memory 108 is arranged in a plurality of zones each corresponding to a plurality of memory locations. As one example, where the subsystem includes a hard-disk, the zones may correspond to sectors. The data may additionally be organized in units of further granularity. For instance, the sectors may each include a plurality of tracks, which in some cases can overlap one another in a shingled fashion.

The subsystem 100 maintains a first copy 110 of a logical-to-physical address mapping in the non-volatile memory 108. As shown, the logical-to-physical address mapping 108 may be referred to as a translation table. The first copy 110 of the translation table may reside in a dedicated portion of the non-volatile memory 108 in certain cases (e.g., a physically or logically contiguous set of addresses). In alternative configurations, the first copy 110 is distributed across disparate physical and/or logical portions of the memory 108.

The controller 106 is in communication with the non-volatile memory 108 and with the interface 104, and generally controls the operation of the subsystem 100. The controller 106 may include one or more microprocessors executing firmware code, field-programmable gate arrays (FPGAs), application-specific circuitry, or a combination thereof. Firmware may be stored in any appropriate type of non-transitory computer readable medium, such as a solid state memory device.

The controller 106 can further include or be otherwise be associated with a second copy 112 of the translation table. The storage subsystem 100 can include a second memory 113 that is different than the non-volatile memory 108, which is a volatile memory (e.g., DRAM) in certain embodiments. The second copy 112 of the mapping is stored in the second memory 113. In some implementations, the second memory 113 is a non-volatile memory, or in some other memory that is separate from or different than the non-volatile memory 108. In general, the second memory 113 can have significantly faster memory access times as compared to the non-volatile memory 108.

The controller 106 receives commands via the interface 104 from the host system 102. The commands can include write commands, read commands, erase commands, etc. Changes to the translation table can occur during system operation and are tracked as change data 114 in the second memory 113. For instance, one or more commands from the host system 102 may direct the controller 106 to update the translation table, or the controller 106 may itself initiate changes to the translation table.

In some embodiments, the change data 114 is stored separately from the initial version of the second copy 112 of the translation table. In one example scenario, the controller 106 accesses the first copy 110 of the translation table upon power up, and generates the second copy 112 based on the first copy 110. At this point, the first and second copies 110, 112 are identical or substantially identical. During system operation, changes to the translation table are tracked as change data 114 separately from the second copy 112 of the translation table. In the example case, the change data 114 is stored in the second memory 113 along with the second copy 112, although another memory could be used in other configurations. In other embodiments, the second copy 112 of the translation table is updated as the changes occur, and outdated entries in the second copy 112 are overwritten. In such cases, a flag or other appropriate mechanism may be associated with the data to indicate that the entries in the second copy 112 have been changed with respect to the first copy 110 that is stored in the non-volatile memory 108.

Where the change data 114 is stored in volatile memory, the change data 114 will be lost when the subsystem 100 is powered down. Thus, in order to be able to reconstruct the translation table on power up to reflect changes to the table, the controller 108 copies the change data 114 to the non-volatile memory 108. However, while the changes to the translation table may be tracked in the relatively fast memory 113 generally as they occur, the subsystem 100 may copy the change data to the non-volatile memory 108 at relatively less frequent intervals. Because the non-volatile memory 108 has relatively slower access speeds than the memory 113, this approach can improve system performance. In other cases, the change data 114 is copied to the non-volatile memory 108 as the changes occur.

On power up, the controller 106 uses the first copy 110 of the translation table along with the translation table change data that was copied to the non-volatile memory 108 to reconstruct the translation table. The controller 106 updates the first copy 110 to reflect the reconstructed table, and similarly updates the second copy 112. As will be described in greater detail, proper selection of the scheme used to manage the translation table changes in the non-volatile memory 108 can advantageously reduce the time required to reconstruct the table on power up.

Figure 2:
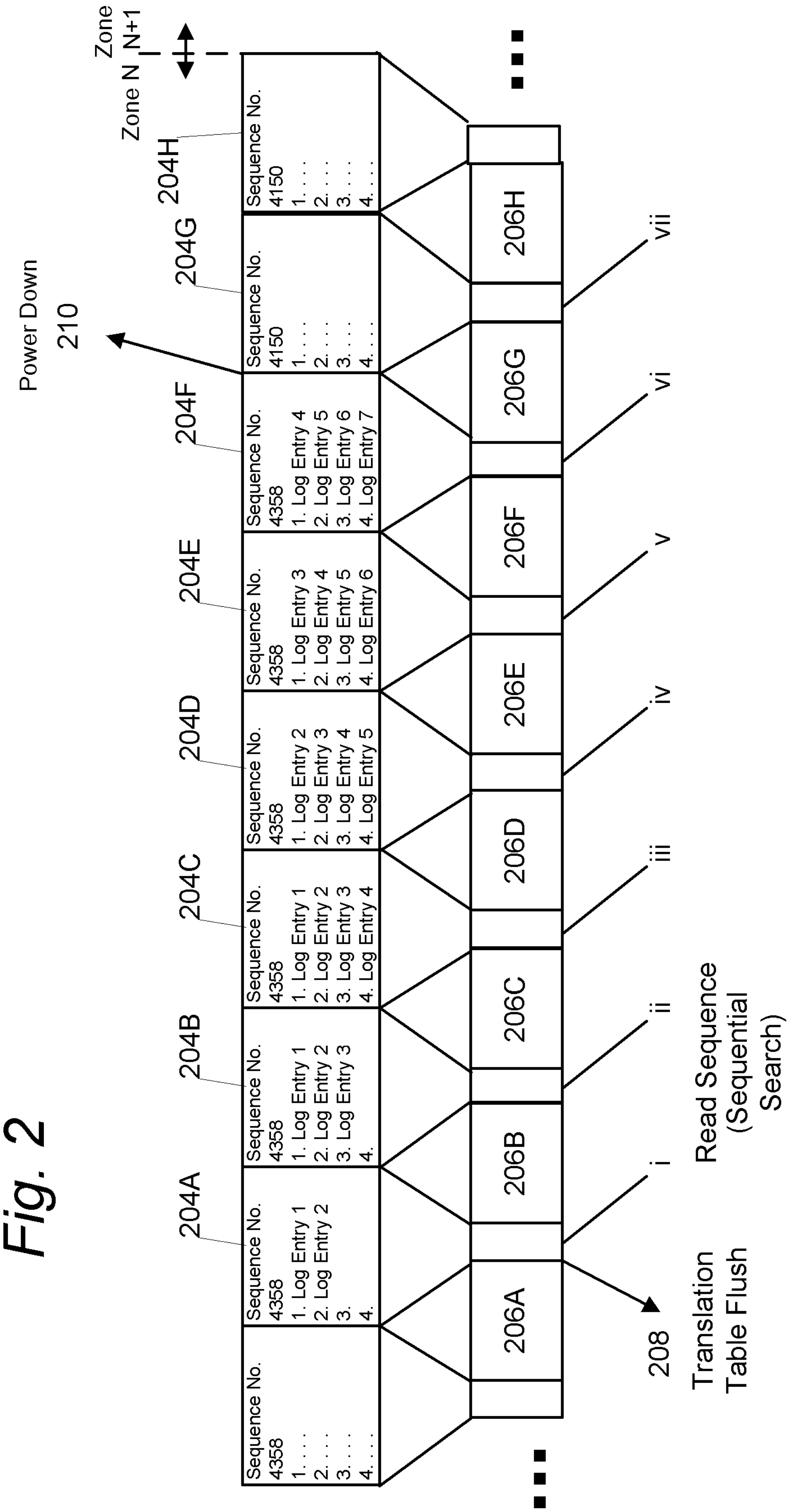
FIG. 2 schematically illustrates an example technique for maintaining changes to a logical-to-physical address mapping, and for recovering the current version the mapping using a sequential search.

FIG. 2 illustrates an example technique for maintaining changes to the translation table in a non-volatile memory 108, and for recovering the current version of the translation table using a sequential search. FIG. 2 logically depicts a portion of the address space of the non-volatile memory 108. Although other approaches are possible, in the illustrated example, metadata units 204 are stored at regular intervals, between user data segments 206. The metadata units 204 store change data indicative of changes with respect to the first copy 110 of the translation table. In the illustrated configuration, the change data is represented by a plurality of "Log Entries", which may each reflect changes to mappings of one or more locations in the non-volatile memory.

As shown, the metadata units 204 can also include a "sequence number". The sequence number generally provides an indication of whether the data written to the particular metadata unit 204 and corresponding user data segment 206 is current. For example, the sequence number may correspond to the currently active zone. The sequence number for a particular metadata unit 204 may be updated with the current sequence number when data is written to the metadata unit 204 (and corresponding user data segment 206). Thus, metadata units 204 having outdated sequence numbers are from previous, now inactive zones. To determine whether a metadata unit includes current data, the controller 106 can additionally maintain a global sequence number corresponding to the currently active zone, and compare a retrieved sequence number from a particular metadata unit 204 to the global sequence number. If the global sequence number and retrieved sequence number match, the particular metadata unit 204 and user data segment 206 include current data. If not, they were written as part of a previous, inactive zone. The sequence number can be incremented when a new write zone is opened up in some cases, upon a translation table flush, or both.

The first copy 110 of the translation table in certain embodiments is stored logically and/or physically separate from the change data. For instance, the first copy 110 in some embodiments is stored in a set of logically or physically contiguous or substantially contiguous locations in the non-volatile memory 108.

As illustrated by the arrow 208, the controller 106 updates the first copy 110 of the translation table at particular intervals to reflect the accumulated change data. Updating the first copy 110 is also referred to herein as "flushing" the translation table. Although other schemes are possible, in the scenario shown in FIG. 2, the controller 106 flushes the first copy 110 of the translation table at fixed intervals, e.g., after a pre-determined period of time has elapsed or a pre-determined amount of data has been written since the last flush. After a flush, and after writing the next user data segment 206A, new translation table change data is written to the next metadata unit 204A. For example, "Log Entry 1" and "Log Entry 2" are written to metadata unit 204A, "Log Entry 3" is added to metadata unit 204B, and "Log Entry 4" is added to metadata unit 204C. Where the change data is written to the metadata units 204 in this cumulative manner, the metadata units 204 may be described as metadata containers. And, the metadata containers can have finite capacity. While the metadata containers shown in FIG. 2 have a capacity corresponding to four log entries, the metadata containers can be any appropriate size. Once a metadata container is full, new change data pushes old change data out of the container according to the scheme depicted in FIG. 2. For instance, the controller 106 overwrites "Log Entry 1" in metadata unit 204D with "Log Entry 5", overwrites "Log Entry 2" in metadata unit 204E with "Log Entry 6", and overwrites "Log Entry 3" in metadata unit 204F with "Log Entry 7".

As indicated by the arrow 210, a power down event occurs after writing "Log Entry 7" to the metadata unit 204D. On power up, the controller 106 begins the process of re-building the translation table from the non-volatile memory 108. The change data written prior to the most recent translation table flush is irrelevant in reconstructing the translation table because this change data would already be reflected in the first copy 110 of the translation table as a result of the flush. Thus, the controller 106 locates the metadata unit 204A written immediately after the last translation table flush 208 by accessing a pointer or other appropriate metadata. This pointer may have been stored at the time the flush operation occurred, for example. To locate the last metadata unit 204F written before power down, the controller 106 executes a sequential search through the non-volatile memory 108, starting at metadata unit 204A. Because metadata unit 204G is the first metadata unit containing an outdated sequence number ("4150"), the controller 106 determines that the previous metadata unit 204F was the last written metadata unit written in the active zone before power down. The controller 106 then creates the current version of the translation table by updating the first copy 110 of the translation table with the change data corresponding to log entries 1-7 found in metadata units 204A-204F during the sequential search.

For the purposes of illustration, only seven metadata units and corresponding user data segments are searched through in the scenario depicted in FIG. 2. In practice, much longer searches are possible. And, sequentially searching through significant amounts of non-volatile memory in order to reconstruct all of the unflushed change data can take a relatively long time. Thus, the technique described with respect to FIG. 2 can lead to slow power up cycles.

Figure 3A:
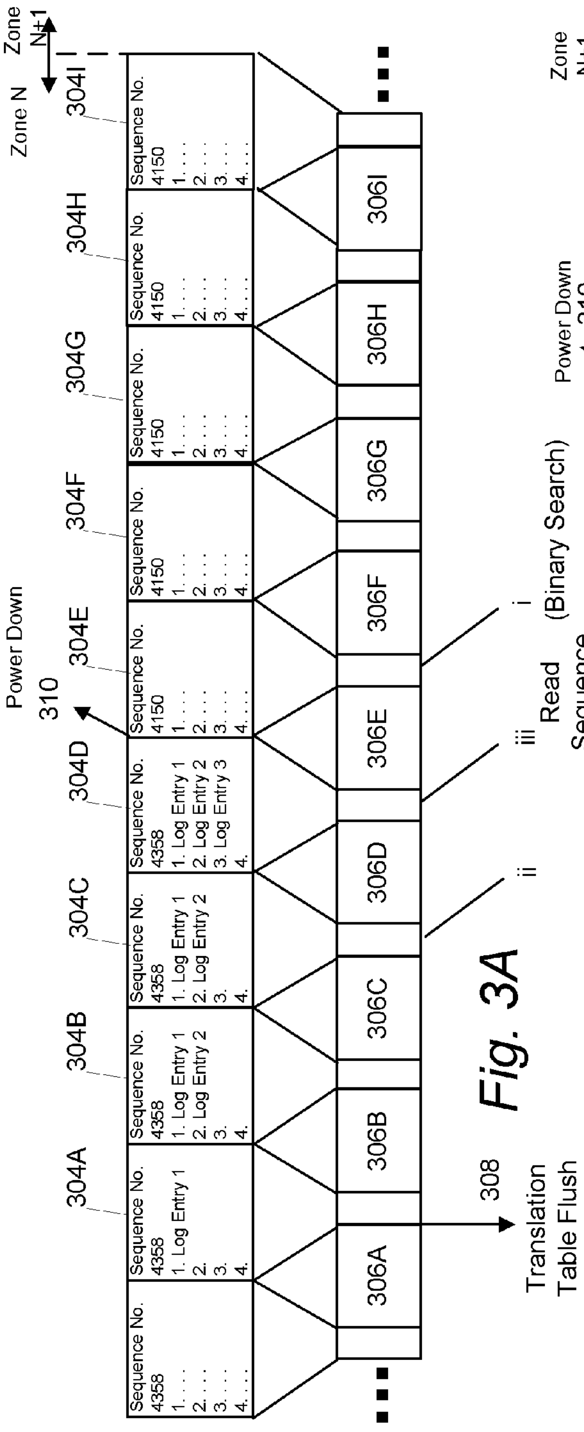
FIGS. 3A and 3B schematically illustrate further example techniques according to certain embodiments described herein for maintaining changes to a logical-to-physical address mapping, and for accelerated recovery of the mapping.
Figure 3B:
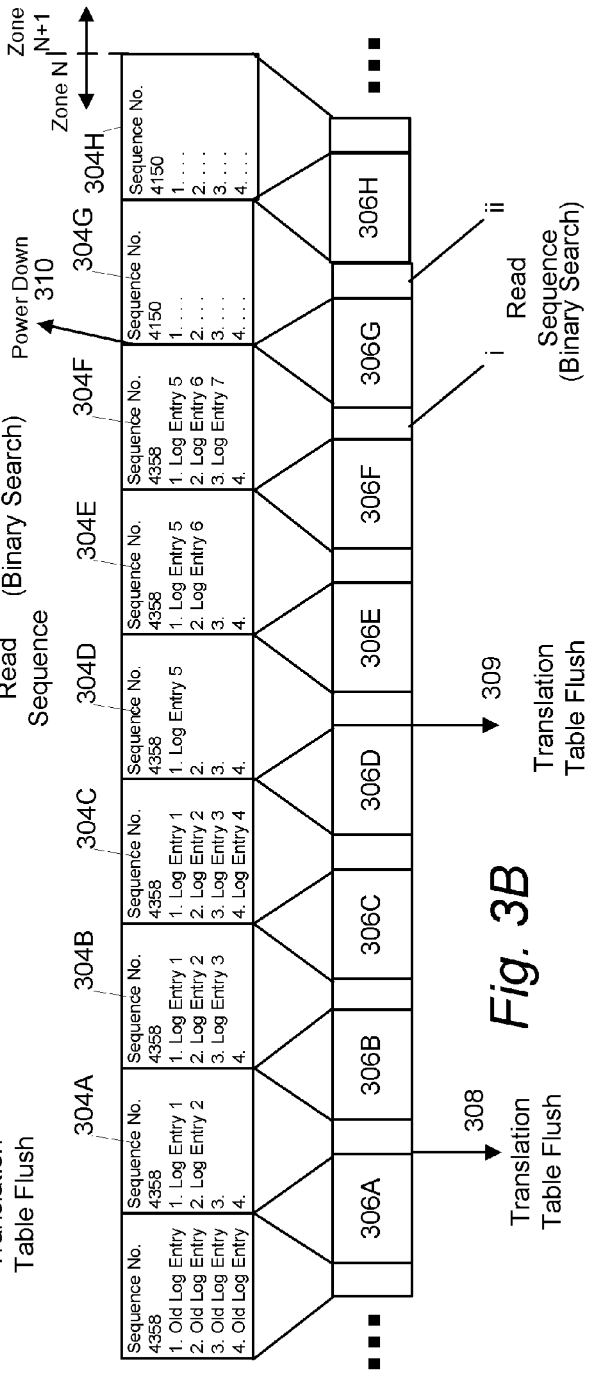

FIGS. 3A-3B illustrate operation of the subsystem 100 according to certain embodiments, where the subsystem 100 performs accelerated recovery of the translation table. The embodiments described with respect to FIGS. 3A-3B advantageously do not involve the use of a sequential search through the non-volatile memory 108 to reconstruct the translation table.

FIG. 3A depicts a first example scenario in which three translation table change log entries are written following a translation table flush 308. Unlike the case described above with respect to FIG. 2, the controller 106 flushes the translation table upon accumulating a threshold amount of change data in the non-volatile memory 108. For instance, the controller 106 flushes the translation table upon reaching the capacity of the metadata container. Thus, in the illustrated example, four log entries were flushed to the translation table prior to writing user data segment 306A. Then, the controller 106 writes “Log Entry 1” to metadata unit 304A and adds “Log Entry 2” to metadata unit 304B. No new log entry is added to metadata unit 304C. This may be because no new change data was received from the controller 106 for this particular interval. “Log Entry 3” is added to metadata unit 304D, and then a system power down event 310 occurs.

Upon power up, the controller 106 locates the first metadata unit 304A written after the last translation table flush. Because the translation table is flushed upon reaching the capacity of the metadata container, the controller 106 can assume that the last metadata unit written before the power down event 310 includes all or substantially all of the change data (Log Entries 1-3) needed to reconstruct the translation table. Thus, the controller 106 can execute a binary or other non-sequential search to efficiently locate the last metadata unit 304D written before the power down 310, and without having to read all of the intermediate metadata units.

In the illustrated case, the controller 106 executes a binary search by accessing the metadata unit 304E mid-way between the metadata unit 304A and the end of the current zone. Because the sequence number corresponding to the metadata unit 304E is an outdated sequence number (“4150”), the controller 106 determines that the last metadata unit written before the flush is located between the metadata unit 304A and the metadata unit 304E. Continuing with the binary search, the controller 106 accesses the metadata unit 304C midway between the last accessed metadata unit 304E and the metadata unit 304A. The controller 106 determines that the sequence number corresponding to the metadata unit 304C is the current sequence number (“4358”), and therefore determines that metadata unit 304D is the last metadata unit 304 written before the power down event 310. The controller 106 then uses the change data from the metadata unit 304D (“Log Entries 1-3”) and the first copy 110 of the translation table to construct an up-to-date version of the translation table.

FIG. 3B illustrates a second example scenario for the subsystem 100 described with respect to FIG. 3A, but where a different sequence of change data is written to the non-volatile memory 108. The controller 106 executes a first translation table flush 308 when the metadata container reaches capacity. “Log Entry 1” and “Log Entry 2” are written to metadata unit 304A, “Log Entry 3” is added to metadata unit 304B and “Log Entry 4” is written to metadata unit 304C. Because the capacity of the metadata container has been reached, the controller 106 executes a second translation table flush 309, updating the first copy 110 of the translation table, before writing the “Log Entry 5” to metadata unit 304D. Then, the controller writes “Log Entry 6” to metadata unit 304E and “Log Entry 7” to metadata unit 304F. A power down event 310 occurs before any data is written to metadata unit 304G.

In reconstructing the translation table as shown in the scenario of FIG. 3B on power up, the controller can assume, as in the scenario of FIG. 3A, that all of the change data needed to reconstruct the translation table is present in the last metadata unit written before the power down event 310. To locate this metadata unit, the controller executes a binary search of the metadata units following the last translation table flush. Thus, the controller reads the sequence number of metadata unit 304F, which is mid-way between the metadata unit 304C written before the last translation table flush and the last metadata unit 304H in the active zone. Because the sequence number (“4358”) is current, the controller 106 continues the search, accessing the metadata unit 304G which is mid-way between the end of the zone and the last metadata unit 304F accessed in the binary search. Because the sequence number (“4150”) is out of date and the metadata unit 304F immediately follows metadata unit 304F, the controller 106 determines that metadata unit 304F is the last metadata unit written before the power down event 310. The controller then uses the change data from the metadata unit 304F (“Log Entries 5-7”) and the first copy 110 of the translation table to construct an up-to-date version of the translation table.

Figure 4:
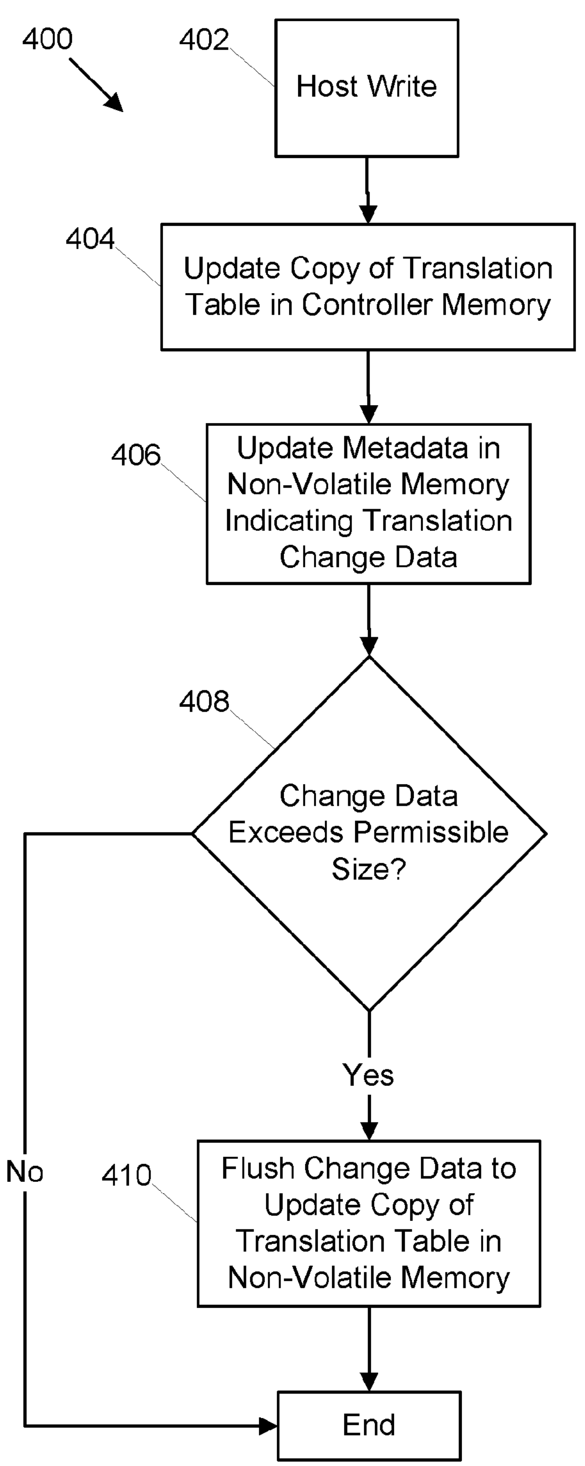
FIG. 4 is a flowchart depicting an example process for maintaining changes to a logical-to-physical address mapping, according to certain embodiments.

FIG. 4 is a flowchart depicting an example process 400 for maintaining changes to a logical-to-physical address mapping. Some or all of the steps of the process 400 may be implemented by the subsystem controller 106. At operational block 402, the subsystem 100 receives memory access commands from the host 102. In response to the commands, or in response to events internal to the subsystem 100, there may be changes to the logical-to-physical address mapping. At block 404, the controller 106 updates the second copy 112 of the translation table in the memory 113 associated with the controller 106 (e.g., DRAM or other volatile memory) to reflect the changes. In some other embodiments, the changes are stored separately from the second copy 112.

At block 406, the controller 106 updates metadata in the non-volatile memory 108 with the translation change data. For instance, as described with respect to FIGS. 3A-3B, metadata units 204 may be written at intervals between fixed or variable length segments of user data. While shown in FIGS. 3A-3B as being written at fixed intervals, after each user data segment 206, the metadata may be written according to other schemes. For instance, metadata for more than one user data segment 206 may be written together.

At block 408, the controller 106 determines whether the change data stored in the non-volatile memory 108 exceeds a permissible size or threshold amount. For instance, a threshold amount of change data may correspond to a certain number of log entries in a metadata container. As shown in FIGS. 3A-3B, the threshold may correspond to a capacity of a change log container. The flushing of the change data may more generally occur before overwriting any previously accumulated change data, as shown in FIGS. 3A-3B, and unlike the configuration depicted FIG. 2. While the threshold is fixed in some cases, the threshold may be dynamically adjusted. The threshold can be configured by the user in some cases as well.

If the amount of change data exceeds the threshold, at block 410 the controller 106 flushes the change data to update the first copy 110 of the translation table in non-volatile memory 108. For instance, the controller 106 combines the accumulated change data with the first copy 110 to generate an updated copy reflective of the changes to the logical-to-physical address mapping since the first copy 110 was last updated. In certain embodiments, only portions of the first copy 110 of the translation table that have changed are updated. For example, the first copy 110 includes a plurality of pages each corresponding to one or more locations in the non-volatile memory 108. Only the pages corresponding to locations with changed logical-to-physical mappings are updated by the controller 106 during the translation table flushing process. In another embodiment, each changed entry is updated. In yet another configuration, the entire first copy 110 of the translation table is updated during a flush operation.

Figure 5:
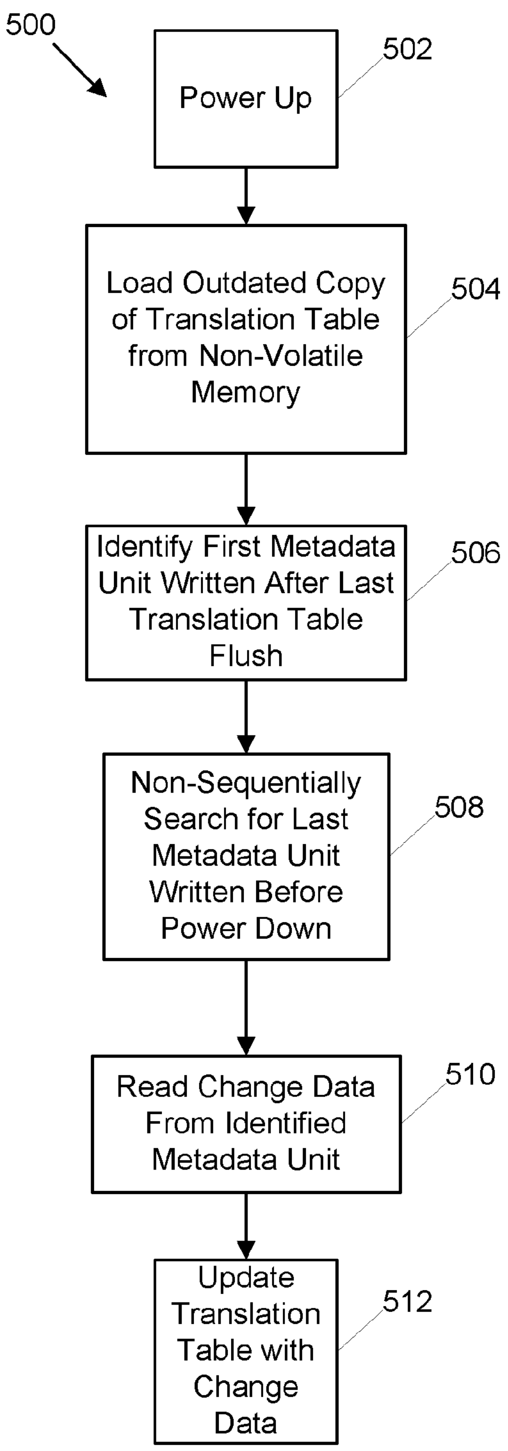
FIG. 5 is a flowchart depicting an example process for accelerated recovery of a logical-to-physical address mapping, according to certain embodiments.

FIG. 5 is a flowchart depicting an example process 500 according to certain embodiments described herein for accelerated recovery of a logical-to-physical address mapping. Some or all of the steps of the process 500 may be implemented by the subsystem controller 106. And the accelerated translation recovery process 500 may be implemented in conjunction with the process 400 of maintaining the translation table described with respect to FIG. 4.

At block 502, a power up condition occurs. The power up may follow either a planned or unintended power down event. At block 504, the controller loads the first copy 110 of the translation table from non-volatile memory 108. Because the first copy 110 is not flushed or otherwise updated in real-time with translation table change data during system operation, the controller 106 cannot assume that the first copy 110 is an up to date version. But, the translation table is flushed upon accumulation of a threshold amount of change data and/or before overwriting previously accumulated change data. As such, the controller 106 can assume that the last metadata unit 204 written before the power down operation includes all or substantially all of the change data for reconstructing the translation table.

To locate the last metadata unit 204 written before the power down event, at block 506 the controller 106 identifies the first metadata unit 204 written after the last translation table flush. For instance, the controller 106 may store a pointer or other mechanism in response to a flush operation, and the controller may later access the pointer at block 506. To locate the last metadata unit written before the power down, the controller 106 can advantageously execute a binary or other non-sequential search at block 508.

At block 510, the controller reads the change data in the identified last metadata unit 204. And, at block 512 the controller 106 updates the first copy 110 translation table with the change data to construct an updated version of the translation table. As described above with respect to the flush operation of block 410 of FIG. 4, at block 512, the controller 106 may either update only changed portions of the translation table (e.g., pages with changed data), or may rewrite the entire first copy 110 of the translation table.

The features and attributes of the specific embodiments disclosed above may be combined in different ways to form additional embodiments, all of which fall within the scope of the present disclosure. Although certain embodiments have been disclosed, other embodiments that are apparent to those of ordinary skill in the art, including embodiments which do not provide all of the features and advantages set forth herein, are also within the scope of this disclosure. Accordingly, the scope of protection is defined only by the claims.

What is claimed is:

1. A storage subsystem, comprising:

a first memory, the first memory comprising at least one non-volatile memory device and arranged in one or more zones;

a second memory different than the first memory; and a controller, configured to:

maintain a current version of a logical-to-physical address mapping in the second memory that maps logical addresses to storage locations of the first memory;

at a first point in time, store a copy of the logical-to-physical address mapping in the first memory;

in response to requests from a host system and using the current version of the logical to physical address mapping, store user data in the zones of the first memory;

accumulate, in the first memory, change data indicative of changes to the current logical-to-physical mapping relative to the stored copy of the logical-to-physical address mapping; and at a second point in time later than the first point in time, and upon accumulating a threshold amount of change data in the first memory, update the copy of the logical-to-physical address mapping stored in the first memory to reflect the accumulated change data.

2. The storage subsystem of claim 1, wherein the second memory comprises at least one volatile memory device.

3. The storage subsystem of claim 1, wherein the controller accumulates the change data in the first memory by writing change data to the first memory at intervals spaced by one or more memory locations.

4. The storage subsystem of claim 3, wherein the controller is further configured to locate the most recently written change data stored in the first memory in response to system power-up.

5. The storage subsystem of claim 4, wherein, in response to the system power up, the controller is further configured to update one or more of the current version of the logical-to-physical address mapping and the copy of the logical-to-physical address mapping stored in the first memory to reflect the most recently written change data.

6. The storage subsystem of claim 5, wherein the controller is configured to locate the most recently written change data stored in the first memory using a non-sequential search.

7. The storage subsystem of claim 6, wherein the controller is configured to locate the most recently written change data stored in the first memory using a binary search.

8. The storage subsystem of claim 3, wherein the change data accumulated in the first memory is included in metadata units stored in the first memory that are associated with one or more corresponding user data segments stored in the first memory.

9. The storage subsystem of claim 3, wherein the controller writes the accumulated change data at regular intervals such that successive instances of the accumulated change data are separated from one another in the first memory by a predetermined number of memory locations.

10. The storage subsystem of claim 1, wherein the first memory comprises a hard-drive arranged in a plurality of tracks which are shingled with respect to one another.

11. The storage subsystem of claim 1, wherein the first memory comprises a solid-state drive.

12. The storage subsystem of claim 1, wherein the controller is configured to preserve substantially all of the accumulated change data at least until updating the copy of the logical-to-physical address mapping.

13. A method of maintaining a logical-to-physical address mapping in a first memory of a storage subsystem, comprising:

maintaining, by at least one controller of the storage subsystem, a current version of a logical-to-physical translation table in a second memory different than the first memory, the logical-to-physical translation table mapping logical addresses provided to storage locations of the first memory;

at a first point in time, storing a copy of the logical-to-physical translation table in the first memory;

in response to requests from a host system and using the current version of the logical to physical address mapping, storing user data in a plurality of zones of the first memory;

accumulating, in the first memory, change data indicative of changes to the current logical-to-physical mapping relative to the stored copy of the logical-to-physical address mapping; and at a second point in time later than the first point in time, and upon accumulating a threshold amount of change data in the first memory, updating the copy of the logical-to-physical address mapping stored in the first memory to reflect the accumulated change data.

14. The method of claim 13, wherein the second memory comprises at least one volatile memory device.

15. The method of claim 13, wherein said accumulating comprises writing the change data to the first memory at intervals spaced by one or more memory locations.

16. The method of claim 15, further comprising locating the most recently written change data stored in the first memory in response to system power-up.

17. The method of claim 16, further comprising, in response to the system power up, updating one or more of the current version of the logical-to-physical address mapping and the copy of the logical-to-physical address mapping stored in the first memory to reflect the most recently written change data.

18. The method of claim 17, further comprising locating the most recently written change data stored in the first memory using a non-sequential search.

19. The method of claim 18, further comprising locating the most recently written change data stored in the first memory using a binary search.

20. The method claim 13, further comprising writing the accumulated change data at regular intervals such that successive versions of the accumulated change data are separated from one another in the first memory by a pre-determined number of memory locations.

21. The method of claim 13, further comprising preserving substantially all of the accumulated change data at least until updating the copy of the logical-to-physical address mapping.

* * * * *